(12) United States Patent
Tan et al.

(10) Patent No.: US 12,414,271 B2
(45) Date of Patent: Sep. 9, 2025

(54) HEAT MANAGEMENT STRUCTURE WITH GRAPHENE AND COPPER, AND A FORMATION METHOD THEREOF

(71) Applicant: Chang Gung University, Taoyuan (TW)

(72) Inventors: Cher-Ming Tan, Taoyuan (TW); Hsiao-Chien Chen, Taoyuan (TW)

(73) Assignee: CHANG GUNG UNIVERSITY, Taoyuan (TW)

( * ) Notice: Subject to any disclaimer, the term of this patent is extended or adjusted under 35 U.S.C. 154(b) by 232 days.

(21) Appl. No.: 18/216,167

(22) Filed: Jun. 29, 2023

(65) Prior Publication Data
US 2024/0008228 A1   Jan. 4, 2024

(30) Foreign Application Priority Data
Jul. 1, 2022   (TW) ................... 111124861

(51) Int. Cl.
| | | |
|---|---|---|
| *F28F 21/08* | (2006.01) | |
| *B23P 15/26* | (2006.01) | |
| *B32B 9/00* | (2006.01) | |
| *B32B 9/04* | (2006.01) | |
| *B32B 15/20* | (2006.01) | |

(Continued)

(52) U.S. Cl.
CPC .......... *H05K 7/20481* (2013.01); *B23P 15/26* (2013.01); *B32B 9/007* (2013.01); *B32B 9/041* (2013.01); *B32B 15/20* (2013.01); *C25D 5/54* (2013.01); *F28F 3/00* (2013.01); *F28F 21/02* (2013.01); *F28F 21/085* (2013.01); *B32B 2250/40* (2013.01); *B32B 2307/302* (2013.01); *C25B 11/043* (2021.01); *C25D 3/38* (2013.01); *F28F 2255/00* (2013.01)

(58) Field of Classification Search
CPC .. B23P 15/26; B23P 2700/10; Y10T 29/4935; Y10T 29/49366; F28F 3/00; F28F 2013/001; F28F 21/02; F28F 21/085; F28F 2255/00; B32B 9/007; B32B 9/041; B32B 15/04; B32B 15/20; B32B 2250/03; B32B 2250/40; B32B 2307/302; C25D 3/38; C25D 5/54; C25B 1/135; C25B 1/50; C25B 11/043; C25B 11/045; B05D 2202/45; H05K 7/20481
See application file for complete search history.

(56) References Cited

U.S. PATENT DOCUMENTS

2006/0063018 A1* 3/2006 Krassowski ........... B21D 39/00
                                                 428/650
2010/0326645 A1* 12/2010 Fan ....................... H01L 23/367
                                                 165/185

(Continued)

FOREIGN PATENT DOCUMENTS

CN      106515134 A   *  3/2017  ............ B32B 15/01

*Primary Examiner* — Matthew P Travers
(74) *Attorney, Agent, or Firm* — BACON & THOMAS, PLLC

(57) ABSTRACT

The invention relates to a heat management structure with graphene and copper, and a formation method thereof, comprising a copper foil layer provided, then forming a graphene layer on the copper foil layer surface, and forming an electroplating copper layer on the graphene layer surface, and eventually forming an electroplating copper layer-graphene layer-copper foil layer sandwich heat management structure.

3 Claims, 7 Drawing Sheets

(51) Int. Cl.
*C25B 11/043* (2021.01)
*C25D 3/38* (2006.01)
*C25D 5/54* (2006.01)
*F28F 3/00* (2006.01)
*F28F 21/02* (2006.01)
*H05K 7/20* (2006.01)

(56) References Cited

U.S. PATENT DOCUMENTS

| | | | |
|---|---|---|---|
| 2015/0253089 A1* | 9/2015 | Fan | H01L 23/3731 |
| | | | 165/185 |
| 2016/0076829 A1* | 3/2016 | Lee | F28F 21/08 |
| | | | 428/41.8 |
| 2017/0115074 A1* | 4/2017 | Cheng | F28F 21/085 |
| 2018/0087398 A1* | 3/2018 | Forcier | F28D 15/046 |
| 2019/0062921 A1* | 2/2019 | Adams | C01B 32/186 |
| 2020/0165503 A1* | 5/2020 | Borini | H01L 23/373 |
| 2020/0294684 A1* | 9/2020 | Bayes | B32B 15/20 |
| 2022/0174844 A1* | 6/2022 | Maekawa | F28F 21/02 |
| 2022/0397352 A1* | 12/2022 | Hsu | C23C 14/562 |

\* cited by examiner

| Base Material | Max Temp.(°C) | Rise Time (s) | Fall Time (s) |
|---|---|---|---|
| No base | 70.76 | 41.26 | 20 |
| Cu | 57.74 | 31.9 | 8 |
| Cu foam | 53.98 | 39.8 | 8 |
| Cu-Gr | 50.39 | 13.3 | 2 |
| Cu-Gr-foam | 48.63 | 17 | 3 |

Figure 6

HEAT MANAGEMENT STRUCTURE WITH GRAPHENE AND COPPER, AND A FORMATION METHOD THEREOF

BACKGROUND OF THE INVENTION

1. Field of the Invention

The invention relates to a heat management structure and a formation method thereof, particularly to a heat management structure with graphene and copper, and a formation method thereof.

2. Description of the Prior Art

Accompanying with the development of light-weight and high-efficiency electronic products, as well as the needs of future 5G/6G communication equipment, the heat management industry is currently growing at an annual rate of about 26.1%, in 2022, and the market size is expected to exceed several tens of billions of US dollars. The demand for heat management structures is derived from the electronic products such as cloud servers, notebook computers, smart phones, networking communication equipment, smart home appliances, and automotive electronics and the like. Especially, when various kinds of electronic products are developed with a trend towards being dense, small, light, and thin, and the electronic products often need to work under the conditions of high functionality and high operational rate, various electronic components installed in electronic products, such as the central processing unit (CPU), and the graphics processing unit (GPU) etc., have their working temperature increases significantly, making the heating power of the various components and related systems increase significantly.

In addition, accompanying the rapid development in the electronic industry in three major areas (high performance, miniaturization, and integration), the degree of the heat management problem of electronic products increases, and the heat flux density of electronic products is continuously increasing, rendering higher heat management requirements for electronic components and effective solutions of the heat management problem become a key technology in the production of electronic products. Furthermore, the heat management of electronic products relates to the reliability and service life of electronic products. Consequently, heat management is critical to the development of today's electronic industry.

Traditionally, when the heating power of electronic product is low, a sufficient solution to heat management was to add a cooling fan or heat management fan to dissipate heat from electronic product. However, as the functions and power of electronic products have increased, the requirements for thermal management technology have become more and more stringent. Furthermore, the requirement of low thermal resistance for the thermal path from inside to outside of electronic products, through the use of high-efficiency heat management elements, becomes an important key of the thermal management technology. As the energy consumption and the waste heat generated by the electronic components will seriously impact the operation and efficiency of electronic products, how to effectively eliminate or reduce the adverse effects of the waste heat will become key points in the development of the electronic components.

In the past, conventional heat management materials such as copper, and aluminum etc. have been widely used in the heat management field of electronic components and the other products. However, in the recent years, due to the rapid development of the graphene radiator, graphene can be gradually used to replace conventional metal heat conduction materials. Due to the advantages of high thermal conductivity, high reliability, and small size, the graphene radiator can be used with other heat management modules to achieve higher heat management effects. The main reason that graphene can achieve higher a heat management effect is because of its hexagonal mesh plane structure, which can quickly and effectively distribute the heat energy in a two-dimensional plane. The graphene radiator can formed with any of natural graphene flakes, artificial graphene flakes, carbon nanotubes and other forms, according to different kinds of structure or production method. Theoretically speaking, the thinner the graphite flake, the higher the thermal conductivity. For example, the natural graphene flake is the thickest one among these three types of graphene flakes, so that the heat management efficiency is lowest. While the artificial graphene is made by carbonizing in an extremely high temperature environment, the thickness can be lower than 0.01 mm, but the price will be much more expensive.

Among all kinds of graphite products, the heat management property of graphene is superior to others. Graphene is a kind of hexagonal plane film composed of carbon atoms with a honeycomb lattice structure. Graphene is essentially a two-dimensional material, having a thickness of only one carbon atom. At present, graphene is the thinnest and the hardest nanomaterial in the world, and is almost completely transparent, absorbing only 2.3% of light. The thermal conductivity of graphene is up to 5,300 W/m·K, which is higher than that of carbon nanotube and diamond. Under the normal temperature temperature, the electron mobility exceeds 15,000 $cm^2/V·s$, and graphene is also a material with the smallest resistivity.

Previously, many technologies have used carbon materials or carbon composite materials as heat management materials. These may include: surface-modified graphene nanoflake dispersed in a resin, wherein mutual contact is enhanced through fillers to form a thermal conduction network; composite materials of graphene/graphite nanoplate/carbon nanotube/nanometal used as the heat management materials; graphene, prepared and mixed with high density polyethylene to form a heat management composite material; a graphene slurry deposited on a copper foil, wherein the graphene layer is consolidated under pressured to reduce the thickness; a graphene composite film formed by a graphene oxide gel-bonded nanographene flake in order to exhibit high thermal conductivity in the display; or heat management materials wherein graphene is grown by a chemical vapor deposition on a nickel foam to form a three-dimensional interconnected porous graphene foam structure, adding needle-shaped nanoparticles between the graphene films, so that the particles are compressed to increase the adhesion between the graphene films to form a graphene block heat management structure.

The structure of graphene is very stable. The distance between carbon-carbon bonds is only 1.42 Å, and the connection among carbon atoms in the graphene is very flexible. When an external force is applied to graphene, the surface of the carbon atoms will be bent and deformed, so that the carbon atoms are not rearranged, to accommodate the external forces, thus, keeping the structure stable. This stable lattice structure generally will enable an excellent thermal conductivity of the graphene. In addition, due to the strong interatomic force, under the normal temperature, even if the surrounding carbon atoms collide, the disturbance to the electrons inside graphene still will be very small. Therefore, the graphene composites used as heat management materials in the prior art are all prepared by blending. The amount of the graphene required for the process is large, and whether or not a good thermal conductivity for the graphene will exist must be considered if the blended matrix is used. Moreover, the problem of dispersion of the graphene into the increases technical challenges and the process cost, and consideration of deformation of the heat management structure, caused by creep of polymer under high temperature, must be considered for the use of composite material mixed with polymer.

In addition, the previous literature has demonstrated that graphene/copper composites can reduce the thermal expansion coefficient. At room temperature, the thermal expansion coefficient of copper is $24\times10^{-6}$ $K^{-1}$, and the thermal expansion coefficient of graphene is $-6\times10^{-6}$ $K^{-1}$. The large difference between the copper and the graphene will form a large number of dislocations which causes dislocation strengthening, resulting in the improvement of the residual stress strengthening ability of the graphene and the copper. Therefore, under the strengthening mechanism, the graphene and copper not only can improve mechanical properties, but also can avoid damage of the structure caused by the stress generated by the different expansion rates during the heat dissipation period.

Summarized from the above, heat management properties for copper metal, aluminum metal, or graphene are all quite excellent. In the past, a single option was used as the heat management material. If a variety of choices can be made and can be effectively used for the heat management structure, the graphene can meet the industrial heat management requirements and meet the industrial expectations, which is become the development trend of heat management structure for the next generation.

SUMMARY OF THE INVENTION

Heat management for electronics means to management the heat so that it can be channeled away from components quickly and thus ensure its lower steady state temperature. The invention relates to a heat management structure with graphene and copper, and a formation method thereof, the method comprising providing a copper foil layer, forming a graphene layer on the copper foil layer surface, forming an electroplating copper layer on the graphene layer surface, and then forming a heat management structure as a "sandwich" formed by the electroplating copper layer, the graphene layer and the copper foil layer. Taking the resistance heating test as an example, the heat management structure of the invention only takes a few seconds for the temperature to drop from the highest temperature to the room temperature, faster than the heat management time without the heat management device. The heat management device of the invention provides a superior heat management effect.

Another aspect of the invention relates to a method for forming a heat management structure with graphene and copper, which uses an electrochemical system, wherein graphite rods are used as cathode and anode respectively, and a saturated calomel electrode is used as reference electrode. In 1 N potassium hydroxide (KOH) electrolyte solution, a 2 V of anodic potential is applied to conduct an electrochemical water decomposition reaction. At the same time, the graphite rods can undergo a "delamination reaction" and gradually darken the color of solution.

Another aspect of the invention relates to a method for forming a heat management structure with graphene and copper, wherein graphene dispersed in KOH solution is purified through repeated processes of high-speed centrifugation and deionized water washing, and the precipitated graphene is redispersed in alcohol.

Another aspect of the invention relates to a method for forming a heat management structure with graphene and copper, which includes continously spraying the graphene dispersion solution on the surface of the copper, and after drying, using the resulting structure as the cathode in an electrochemical system. The anode is platinum, and the reference electrode is a saturated calomel electrode. In 1 M sulfuric acid, electrodeposition is performed in a solution containing 50 mM copper sulfate, with an electric current set at 10 mA, and the reaction is stopped after 5 minutes of the electrodeposition.

Another aspect of the invention relates to a method for forming a heat management structure with graphene and copper, wherein the cathode is washed and dried to obtain a heat management structure formed a a "sandwich" having an electroplating copper layer, a graphene layer and a copper foil layer.

Another aspect of the invention relates to a heat management structure with graphene and copper, comprising, in one embodiment, a copper foil layer, a graphene layer formed on the copper foil layer, and a copper electroplating layer formed on the graphene layer, resulting in a copper foil, graphene and copper electroplate "sandwich" heat management structure. In some embodiments, the copper foil layer can be replaced by the other metals, including (but not limited to) gold, silver, aluminum, and various metals and related alloys. In some embodiments, the graphene layer can be replaced by a layer of natural graphite flakes, artificial graphite flakes, nanocarbon, graphene derivatives, and nanocarbon derivatives. In some embodiments, the electroplating layer can be formed with metals other than copper, including (but not limited to) gold, silver, aluminum, and various metals and related alloys.

One of the advantages for the heat management structure with graphene and copper of the invention is that a flake-shaped light-weight copper foil is adopted as one of the components of the heat management structure, which results in a quick transmission of heat and short cooling time.

Another of the advantages for the heat management structure with graphene and copper of the invention is that an extremely light-weight graphene is used as one of the components of heat management structure, which results in a quick transmission of heat and short cooling time.

for a further advantage of the heat management structure with graphene and copper of the invention is that a light-weight and stacked copper electroplating is used as one of the components of heat management structure, so that the invention provides quick heat dissipation.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 6 illustrates a heat management temperature-time diagram of the invention.

DESCRIPTION OF THE PREFERRED EMBODIMENT

Figure 1:
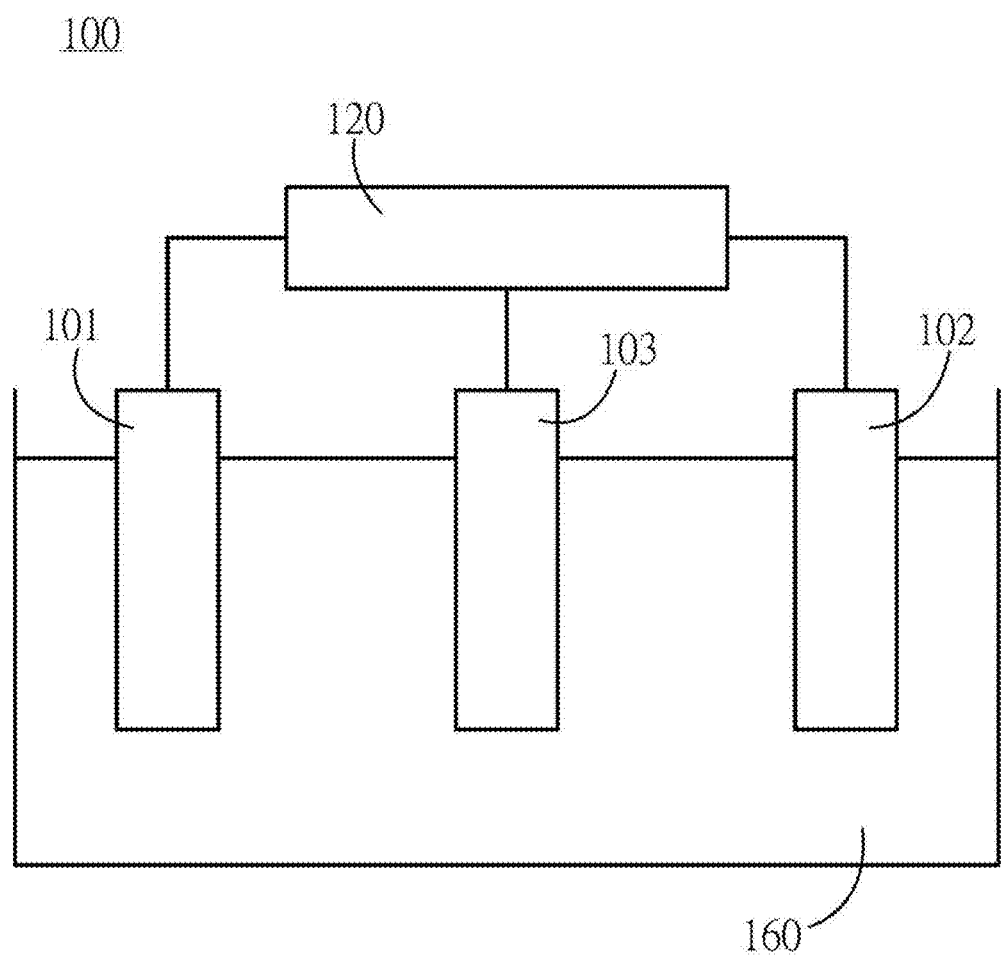
FIG. 1 illustrates a first electrochemical system of the invention.

Please refer to the accompanying figures below for instruction and description, in order to describe the embodiments of the invention according to the schematic diagrams. In the schematic diagrams, the same element symbol represents the same element, and the size or thickness of element may be exaggerated for clarity.

The invention relates to a method for forming a heat management structure with graphene and copper. As shown in in FIG. 1, a first electrochemical system 100 with a first potentiostat 120 is provided, which can be connected to a first cathode 101 provided with a graphite rod, and a first anode 102 provided with a graphite rod, and a saturated calomel electrode 103 is used as the first reference electrode 103. In here, the function of the first reference electrode is to measure the potential of test piece in the current environment, wherein the reference electrode is not affected by the external environment and is maintained at a fixed potential.

Still referring to FIG. 1, in the first electrochemical system 100, a first electrolyte solution 160 of potassium hydroxide (KOH) with a concentration of 1 N is added to form the first electrochemical system 100.

Figure 2:
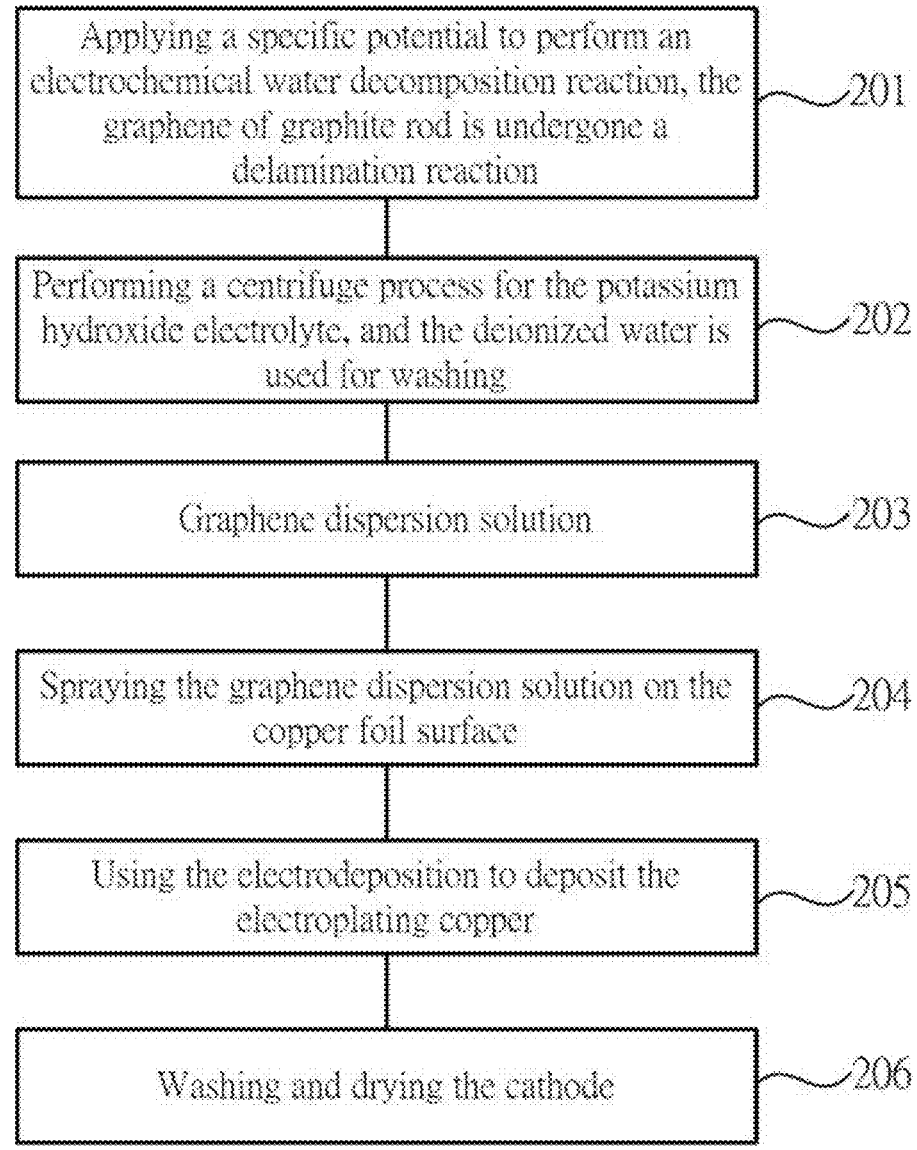
FIG. 2 illustrates the flow diagram for a method of forming a heat management structure with the graphene and the copper according to the invention.

Turning to FIG. 2, an anodic potential of 2 V is applied in Step 201 to perform an "electrochemical water decomposition reaction".

At the same time, the graphene of graphite rod will undergo a "delamination reaction" and gradually darken the color of the first potassium hydroxide electrolyte solution 160 as graphene is dispersed into the electrolyte solution 160.

At Step 202, a centrifuge process of graphene in the potassium hydroxide first electrolyte 160 is performed, and deionized water is used for washing the precipitated graphene to remove potassium hydroxide. The centrifuge and wash processes are repeated several times for purifying the graphene In Step 203, the graphene precipitate is dispersed in alcohol to become a graphene dispersion solution.

Figure 3A:
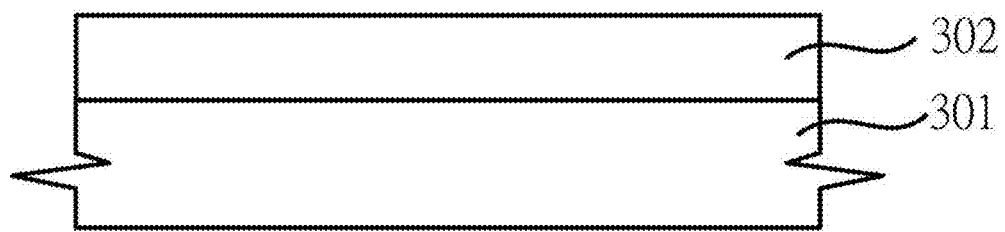
FIG. 3A illustrates a layered structure of the electroplating copper, graphene and copper foil sandwich heat management structure of the invention.

In step 204, the graphene dispersion solution is sprayed on the copper (Cu) foil surface of about 1 cm×4 cm in size, and dried to become a double-layer structure having a graphene 302 layer and a copper foil 301 layer as shown in FIG. 3A.

Figure 4:
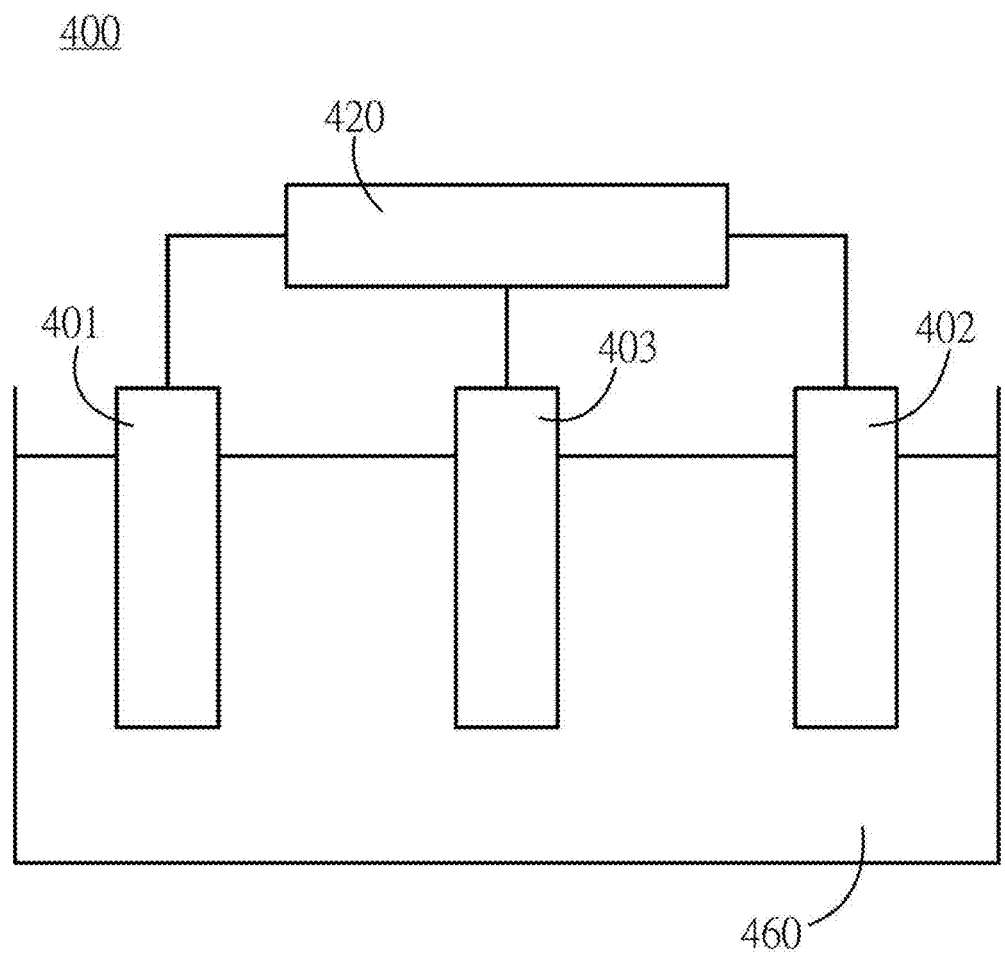
FIG. 4 illustrates a second electrochemical system of the invention.

In step 205, in the second electrochemical system 400 of FIG. 4, a second potentiostat 420 is provided, and the graphene 302 and copper foil 301 double-layer structure is used as a second cathode 401, platinum (Pt) is used as a second anode 402, and the second reference electrode 403 is again a saturated calomel electrode. In the second electrolyte solution 460, at a concentration of 1 M sulfuric acid containing 50 mM copper sulfate, the electroplating copper is deposited by electrodeposition. At this time, the current can be set to 10 mA, and the deposition is carried out for several minutes to form the electroplating copper layer 303 on the graphene layer 302, and then the reaction is stopped.

Figure 3B:
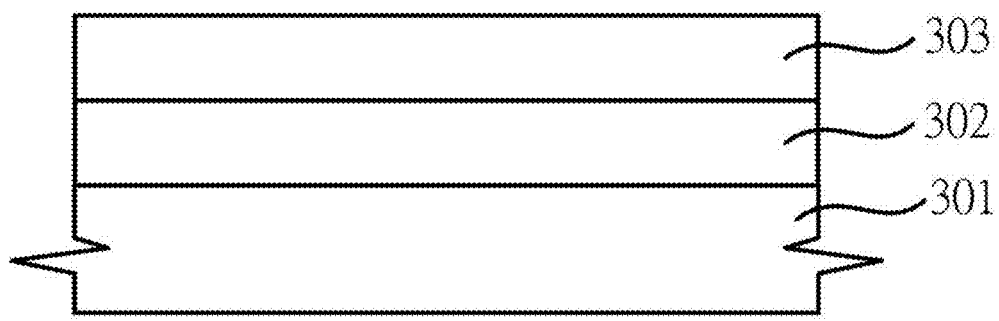
FIG. 3B illustrates a layered structure of the electroplating copper, graphene and copper foil sandwich continuous heat management structure of the invention.

Finally, in step 206, the cathode is washed and dried to obtain the three layered arrangement of the copper foil layer 301, the graphene layer 302 and the electroplating copper layer 303, as a sandwich-style heat management structure as shown in FIG. 3B.

In other embodiments of the three-layered heat management structure shown in FIG. 3B, the copper foil layer 301 can be replaced by other metals, including but not limited to gold, silver, aluminum, and various metals and related alloys.

Also, in other embodiments of the three-layered heat management structure shown in FIG. 3B, the graphene layer 302 can be replaced by natural graphite flakes, artificial graphite flakes, nanocarbon, graphene derivatives, and nanocarbon derivatives.

Further, in other embodiments of the three-layered heat management structure shown in FIG. 3B, the electroplating copper layer 303 can be replaced by other metals, which may include but are not limited to gold, silver, aluminum, and various metals and related alloys.

In the heat management structure, preferably, the thickness of copper foil layer 301 is 200 μm to 5000 μm, the thickness of graphene layer 302 is 1 nm to 100 nm, and the thickness of electroplating copper layer 303 is 200 nm to 1000 nm.

Figure 5:
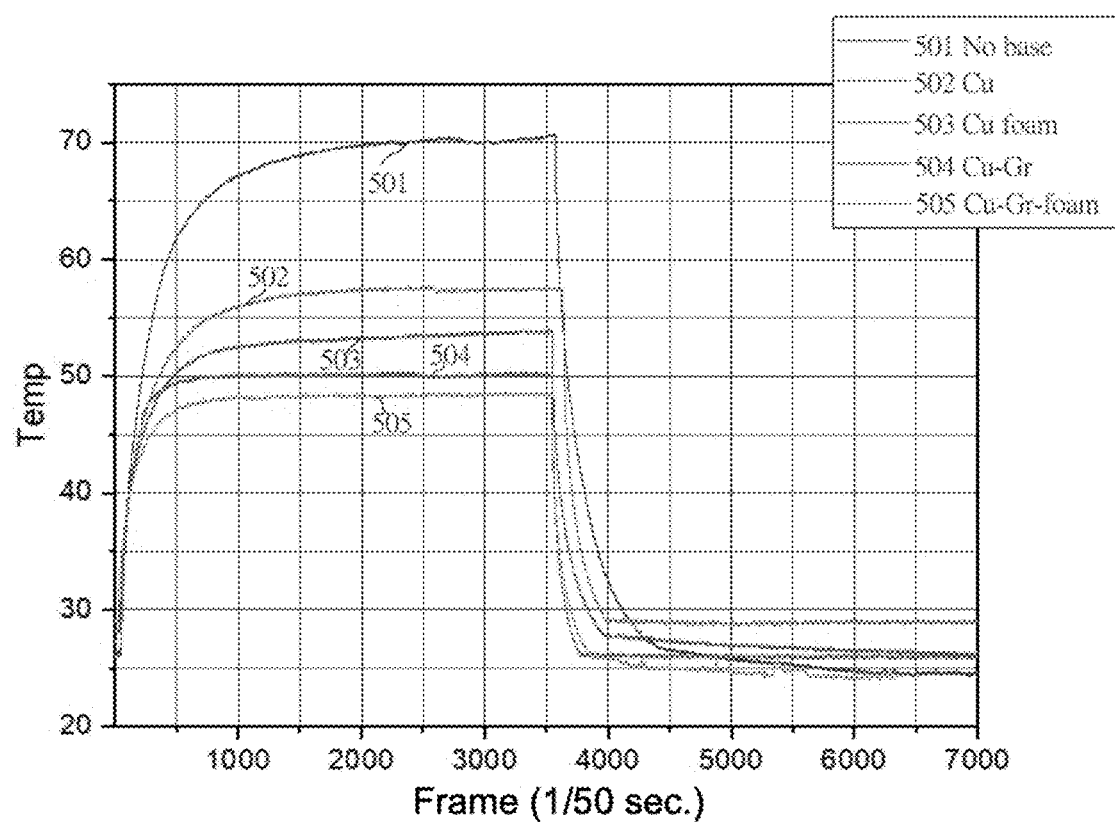
FIG. 5 illustrates a heat management test diagram of the invention.

The heat management test is performed by pumping current to the resistor covered by a heat dissipation structure. Due to Joule heating, the temperature of the resistor will increase. However, this heat will be dissipated and a steady state temperature will be achieved. In FIGS. 5 and 6, results of heat management tests comparing five different heat management structures are shown. The tests consist of determining a maximum temperature, temperature rise time and cooling or fall time for each of the tested structures. FIG. 5 shows the temperature of the resistor under constant current within 0 to 3500 frames and with turning off current after 3500 frames. If the heat dissipation structure can effectively remove the heat, the steady state temperature of the resistor will be lower. If the heat dissipation structure can channel the heat fast, the time to reach steady state temperature and the flow of the temperature when current is turned off will be faster. FIG. 5 and FIG. 6 show a comparison of various heat dissipation structures. After introducing thermal management of Cu-Gr and Cu-Gr-foam, it can significantly reduce the temperature of the resistor under the current supply, and it can quickly return to room temperature after power off. This result shows that our invented structure is the best. The x-axis is shows time in frames (1000 means 1000 frames). In the tests, one frame is 1/50 seconds, and hence 1000 frames is equivalent to 20 seconds.

The heat measurement structures tested include 1) no heat management structure (no base) 501; 2) a copper foil (Cu) heat management structure 502 alone; 3) an electroplating copper (labeled Cu foam in the drawing) heat management structure 503, a copper foil (Cu) and graphene (Gr) layered heat management structure 504; and 5) the copper foil layer 301, graphene layer 302 and electroplating copper layer 303 three-layered heat management structure 505 of the invention. From the diagram, it can be seen that it only takes 3 seconds for the temperature to drop to room temperature for the "electroplating copper layer (Cu foam)-graphene layer (Gr)-copper foil layer (Cu)" as a sandwich-style heat management structure 505 of the invention, indicating that the proposed heat management device has the best heat management effect. It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for forming a heat management structure with graphene and copper, comprising:

providing a first electrochemical system, the first electrochemical system comprising a first potentiostat connected to a first cathode provided with a graphite rod, a first anode provided with a graphite rod, and a saturated calomel electrode as a first reference electrode, the first cathode, the first anode and the reference electrode being immersed in an electrolyte solution of potassium hydroxide;

applying a potential to the first anode to perform an electrochemical water decomposition reaction, wherein a graphene of said graphite rod undergoes a delamination reaction;

performing a centrifuge process for said electrolyte solution of potassium hydroxide, wherein a deionized water is used for washing to obtain washed graphene;

dispersing the washed graphene in alcohol to obtain a graphene dispersion solution;

spraying said graphene dispersion solution on a copper foil surface, and drying the graphene dispersion on the copper foil surface to form a a double-layer structure comprised of a graphene layer and a copper foil layer;

providing a second electrochemical system, the second electrochemical system comprising said double-layer structure as a second cathode, a platinum as a second anode, and a saturated calomel electrode as a second reference electrode, the second cathode, the second anode and the second reference electrode being immersed in a copper sulfate solution, an electroplating copper layer being deposited by electrodeposition on said double-layer structure; and washing and drying said double-layer structure to obtain a three-layered structure comprising said electroplating copper layer, said graphene layer and said copper foil as a sandwich-style heat management structure.

2. The method according to claim 1, wherein said second electrolyte solution in said second electrochemical system comprises 1 M sulfuric acid containing 50 mM copper sulfate.

3. The method according to claim 1, wherein said second electrochemical system comprises a current setting of 10 mA.

* * * * *